US012666721B2

(12) United States Patent
Zhang et al.

(10) Patent No.: US 12,666,721 B2
(45) Date of Patent: Jun. 23, 2026

(54) DISPLAY PANEL

(71) Applicant: TCL CHINA STAR OPTOELECTRONICS TECHNOLOGY CO., LTD., ShenZhen (CN)

(72) Inventors: Xueqiang Zhang, ShenZhen (CN); Qiuxia Shi, ShenZhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 260 days.

(21) Appl. No.: 18/279,401

(22) PCT Filed: Aug. 10, 2023

(86) PCT No.: PCT/CN2023/112291
§ 371 (c)(1),
(2) Date: Aug. 30, 2023

(87) PCT Pub. No.: WO2024/192954
PCT Pub. Date: Sep. 26, 2024

(65) Prior Publication Data
US 2025/0022885 A1     Jan. 16, 2025

(30) Foreign Application Priority Data

Mar. 17, 2023     (CN) .......................... 202310297748.1

(51) Int. Cl.
*H10D 86/60*          (2025.01)
*G09G 3/36*           (2006.01)
(Continued)

(52) U.S. Cl.
CPC ........... *H10D 86/60* (2025.01); *G09G 3/3677* (2013.01); *H10D 86/441* (2025.01); *G02F 1/136286* (2013.01); *G09G 2330/023* (2013.01)

(58) Field of Classification Search
CPC .... H10D 86/60; H10D 86/441; G09G 3/3677; G09G 2330/023; G09G 2300/0421;
(Continued)

(56) References Cited

U.S. PATENT DOCUMENTS 10,608,017 B2 *  3/2020  Takahashi ................ G09G 3/32
12,322,342 B2    6/2025  Zhang et al.
(Continued)

FOREIGN PATENT DOCUMENTS

CN          1727974 A  *  2/2006  ............. G11C 19/28
CN          1866340 A  *  11/2006  ............... G09G 3/20
(Continued)

OTHER PUBLICATIONS

Examination Report Under Sections 12 & 13 of the Patents Act, 1970 and the Patents Rules, 2003 Dated May 11, 2026 From the Government of India, Intellectual Property India, Patents, Designs, Trade Marks, Geographical indications, The Patent Office Re. Application No. 202317074289. (7 Pages).

*Primary Examiner* — Mohammed Shamsuzzaman

(57) ABSTRACT

A display panel is provided, including sub-pixels arranged in a first display region, pixel driving circuits arranged in a first border region, gate lines, and a power control unit. The gate lines include first gate lines arranged in the first display region and at least one second gate line arranged in the first border region. Each first gate line is electrically connected between a gate driver and the corresponding pixel driving circuit. The at least one second gate line is electrically connected to the corresponding pixel driving circuit. A power line of the power control unit is electrically connected to the at least one second gate line.

16 Claims, 5 Drawing Sheets

(51) Int. Cl.
    *H10D 86/40*      (2025.01)
    *G02F 1/1362*      (2006.01)

(58) Field of Classification Search
    CPC ............. G09G 3/20; G09G 2300/0426; G09G
               2310/0218; G09G 2310/0221; G09G
               3/32; G09G 3/36; G09G 3/3607; G09G
               5/14; G09G 2310/0243; G09G
               2310/0264; G09G 2330/00; G02F
               1/136286; G02F 1/133; G02F 1/134345;
               G02F 1/1345
    See application file for complete search history.

(56)           References Cited

U.S. PATENT DOCUMENTS

| | | | | |
|---|---|---|---|---|
| 2004/0113872 A1* | 6/2004 | Nanno | ................. | G09G 3/3258 |
| | | | | 345/76 |
| 2019/0363266 A1* | 11/2019 | Tanaka | ................. | G06F 1/1681 |
| 2021/0202674 A1* | 7/2021 | Jo | ........................ | H10K 59/124 |
| 2022/0352285 A1 | 11/2022 | Shi et al. | | |

| | | | | |
|---|---|---|---|---|
| 2022/0375392 A1* | 11/2022 | Qian | ...................... | G11C 19/28 |
| 2023/0238398 A1* | 7/2023 | Choi | ..................... | H10W 90/00 |
| 2024/0155894 A1* | 5/2024 | Yoon | .................. | H10K 59/1315 |

FOREIGN PATENT DOCUMENTS

| | | | | | | |
|---|---|---|---|---|---|---|
| CN | 106920813 A | * | 7/2017 | .......... | H10D 86/021 |
| CN | 107765482 A | * | 3/2018 | .......... | G09G 3/3674 |
| CN | 108269823 A | * | 7/2018 | .......... | G06F 1/1647 |
| CN | 108598139 A | * | 9/2018 | .......... | G09G 3/3225 |
| CN | 109300406 A | * | 2/2019 | ............ | G09F 9/302 |
| CN | 112258983 A | * | 1/2021 | ............ | H04N 23/57 |
| CN | 114694560 A | * | 7/2022 | .......... | H10W 90/00 |
| CN | 115280406 A | * | 11/2022 | .......... | H10K 59/131 |
| CN | 115621287 A | * | 1/2023 | ............ | H10D 86/60 |
| DE | 102021128542 A1 | * | 6/2022 | .......... | G09G 3/3266 |
| DE | 102022116913 A1 | * | 1/2023 | .......... | G09G 3/3291 |
| GB | 2610080 A | * | 2/2023 | .......... | H10K 59/131 |
| KR | 20160038912 A | * | 4/2016 | .......... | G09G 3/3233 |
| KR | 20210077476 A | * | 6/2021 | ........ | H10K 59/8052 |
| TW | 202228106 A | * | 7/2022 | .......... | G09F 9/3023 |
| WO | WO-2022006769 A1 | * | 1/2022 | .......... | G09G 3/2074 |
| WO | WO 2022/198575 | | 9/2022 | | |

* cited by examiner

DISPLAY PANEL

RELATED APPLICATIONS

This application is a National Phase of PCT Patent Application No. PCT/CN2023/112291 having International filing date of Aug. 10, 2023, which claims the benefit of priority of Chinese Patent Application No. 202310297748.1, filed on Mar. 17, 2023. The contents of the above applications are all incorporated by reference as if fully set forth herein in their entirety.

TECHNICAL FIELD

The present application relates to a field of display technology and in particular, to a display panel.

BACKGROUND OF RELATED ART

With the rapid development of high-speed rail and rail transportation, there is a growing demand for elongated displays. However, elongated displays come in various sizes and have relatively low demand for each size, making the individual development of different-sized elongated screens costly. As a result, there is a need for further segmentation and processing of display screens to obtain displays of different sizes, in order to meet the requirements of diverse applications across various scenarios.

However, after further segmentation of the conventional display screen to create smaller screens, floating gate lines are present near the cutting edge in the boarder. This leads to a situation where the pixel transistors in a border region remain slightly turned-on (weakly open) even when not powered. Data line signals are written through the pixel transistors, causing pixel illumination in the border region and resulting in a phenomenon of light leakage in the border region.

In summary, the structure of the conventional display screen does not support reducing the light leakage in the border region.

SUMMARY OF INVENTION

The present invention provides a display panel to solve technical problems that the structure of conventional display panels does not support reducing light leakage in a border region.

To solve the above problems, the present invention provides technical solutions as follows:

In one aspect, the present invention provides a display panel, including a first display region and a first border region adjacent to the first display region, the display panel including:

a plurality of sub-pixels, including a plurality of first sub-pixels distributed in the first display region and a plurality of second sub-pixels distributed in the first border region;

a plurality of pixel driving circuits, including a plurality of first pixel driving circuits distributed in the first display region and electrically connected to the first sub-pixels and a plurality of second pixel driving circuits distributed in the first border region and electrically connected to the second sub-pixels;

a plurality of gate lines, including a plurality of first gate lines arranged in the first display region and at least one second gate lines arranged in the first border region, wherein each of the first gate lines is electrically connected to one gate driver and the corresponding first pixel driving circuit, and the at least one second gate line is electrically connected to the corresponding second pixel driving circuits; and a power control unit, including a power line electrically connected to the at least one second gate line.

In some embodiments of the present application, the power line is configured to transmit a first supply voltage to the at least one second gate line to control the corresponding second sub-pixels to be in a non-luminating state.

In some embodiments of the present application, the at least one second gate line is electrically insulated from the gate driver.

In some embodiments of the present application, the display panel further includes:

a first metal layer, including the first gate lines and the at least one second gate line;

an insulation layer disposed on the first metal layer; and a second metal layer, disposed on the insulation layer and including a plurality of data lines, electrically connected to the first pixel driving circuits and the second pixel driving circuits, and the power line.

In some embodiments of the present application, the power line connects and contacts the at least one second gate line through the insulation layer.

In some embodiments of the present application, the display panel further includes a second border region adjacent to the first border region and the first display region, and the power line is arranged in the second border region.

In some embodiments of the present application, the power control unit further comprises a switching transistor and a control signal line, a gate of the switching transistor is electrically connected to the control signal line, one of a source and a drain of the switching transistor is electrically connected to the power line, and the other one of the source and the drain of the switching transistor is electrically connected to the corresponding second gate line.

In some embodiments of the present application, the control signal line is disposed in a same layer and made of a same material as the power line.

In some embodiments of the present application, the display panel further includes a second border region adjacent to the first border region and the first display region, and the power line and the control signal line are arranged in the second border region.

In some embodiments of the present application, the gate of the switching transistor is connected to the control signal line through a via hole.

In some embodiments of the present application, each of the at least one second gate line comprises a fan-out section arranged in the second border region, and the other one of the source and the drain of the switching transistor is connected to the corresponding fan-out section through a via hole.

In some embodiments of the present application, the display panel further includes:

a first metal layer, including the first gate lines, the at least one second gate line, and the gate of the switching transistor;

a semiconductor layer, disposed above the first metal layer and including an active layer of the switching transistor; and a second metal layer disposed on the semiconductor layer, the second metal layer including a plurality of data lines electrically connected to the first pixel driving circuits and the second pixel driving circuits, the power line, the control signal line, and the source and the drain of the switching transistor.

In another aspect, the present application further provides another display panel, including a first region and a second region adjacent to the first region, the first region comprising a first display region, the second region comprising a second display region adjacent to the first display region, the display panel comprising:

a plurality of sub-pixels, including a plurality of first sub-pixels distributed in the first display region and a plurality of second sub-pixels distributed in the second display region;

a plurality of pixel driving circuits, including a plurality of first pixel driving circuits distributed in the first display region and electrically connected to the first sub-pixels and a plurality of second pixel driving circuits distributed in the second display region and electrically connected to the second sub-pixels;

a plurality of gate lines, including a plurality of first gate lines arranged in the first display region and a plurality of second gate lines arranged in the second display region, wherein each of the first gate lines is electrically connected to a first gate driver and the corresponding first pixel driving circuit, and each of the second gate lines is electrically connected to a second gate driver and the corresponding second pixel driving circuit; and a power control unit, including a power line, wherein the power line extends from the first region to at least one of the second gate lines arranged in the second region and close to the first gate lines.

In some embodiments of the present application, the power line is electrically connected to or electrically insulated from the at least one of the second gate lines close to the first gate lines.

In some embodiments of the present application, the display panel further includes:

a first metal layer, comprising the first gate lines and the second gate lines;

an insulation layer disposed on the first metal layer; and a second metal layer disposed on the insulation layer, wherein the second metal layer comprises a plurality of data lines, electrically connected to the first pixel driving circuits and the second pixel driving circuits, and the power line.

In some embodiments of the present application, the display panel further includes a border region adjacent to the first display region and the second display region, and the power line is arranged in the border region.

In some embodiments of the present application, the power control unit further comprises a switching transistor and a control signal line, a gate of the switching transistor is electrically connected to the control signal line, one of a source and a drain of the switching transistor is electrically connected to the power line, and the other one of the source and the drain of the switching transistor is electrically connected to the corresponding second gate line.

In some embodiments of the present application, the display panel further includes a border region adjacent to the first display region and the second display region, and the power line and the control signal line are arranged in the border region.

In some embodiments of the present application, the gate of the switching transistor is connected to the corresponding control signal line through a via hole; and/or, each of the second gate lines comprises a fan-out section arranged in the border region, and the other one of the source and the drain of the switching transistor is connected to the corresponding fan-out section through a via hole.

In some embodiments of the present application, the control signal line is disposed in a same layer and made of a same material as the power line.

Advantages

The display panel of the present application includes a first display region and a first border region adjacent to the first display region. The display panel includes a plurality of sub-pixels, a plurality of pixel driving circuits, a plurality of gate lines, and a power control unit. The sub-pixels include a plurality of first sub-pixels distributed in the first display region and a plurality of second sub-pixels distributed in the first border region. The pixel driving circuits include a plurality of first pixel driving circuits distributed in the first display region and electrically connected to the first sub-pixels, and include a plurality of second pixel driving circuits distributed in the first border region and electrically connected to the second sub-pixels. The gate lines include a plurality of first gate lines arranged in the first display region and at least one second gate line arranged in the first border region. Each of the first gate lines is electrically connected between a gate driver and the corresponding first pixel driving circuit. At least one of the second gate lines is electrically connected to the corresponding second pixel driving circuit. The power control unit includes a power line. The power line is electrically connected to at least one of the second gate lines. By transmitting a first power supply voltage to the second gate line of the first border region through the power line, the corresponding second sub-pixels are controlled to be in a non-luminating state, thus preventing occurrence of light leakage in the first border region.

BRIEF DESCRIPTION OF DRAWINGS

In order to more clearly illustrate the technical solutions of the present application, the drawings that need to be used in the description of the embodiments will be briefly introduced below. Obviously, the drawings in the following description are only some of the embodiments of the present application. For those skilled in the art, other drawings can be obtained based on these drawings without creative efforts.

EMBODIMENTS OF PRESENT INVENTION

The technical solutions of the present application are clearly and completely described below with reference to the accompanying drawings and in conjunction with specific embodiments. The described embodiments are merely some of the embodiments rather than all of the embodiments of the present application. All other embodiments obtained by persons of ordinary skill in the art based on the embodiments of the present application without creative efforts shall fall within the protection scope of the present application.

In the description of the present application, it should be understood that the terms "first". "second" are used for illustrative purposes only, and cannot be interpreted as indicating or implying relative importance or implicitly specifying the quantity of indicated technical features. Thus, a feature defined as "first" or "second" may explicitly or implicitly include one or more of said features. In the description of the present application, "multiple" means two or more, unless otherwise specifically defined. In the description of the present application, it should be noted that, unless otherwise expressly specified and limited, the term "connection" should be understood broadly. For example, elements may be electrically connected or may communicate with each other, may be directly connected, or may be indirectly connected through an intermediate medium. It may mean that two elements internally communicate with each other or have an interaction relationship. For those of ordinary skill in the art, the specific meaning of the above terms in the present application can be understood on a case-by-case basis. In the present application, unless otherwise expressly specified and limited, the first feature being "on" the second feature may mean a direct contact between the first feature and the second feature, and may mean an indirect contact between the first feature and the second feature through an additional feature between them. Moreover, the first feature being "on" the second feature may mean that the first feature is right above or obliquely above the second feature, or simply indicates that a horizontal height of the first feature is higher than that of the second feature.

Figures 1, 2:
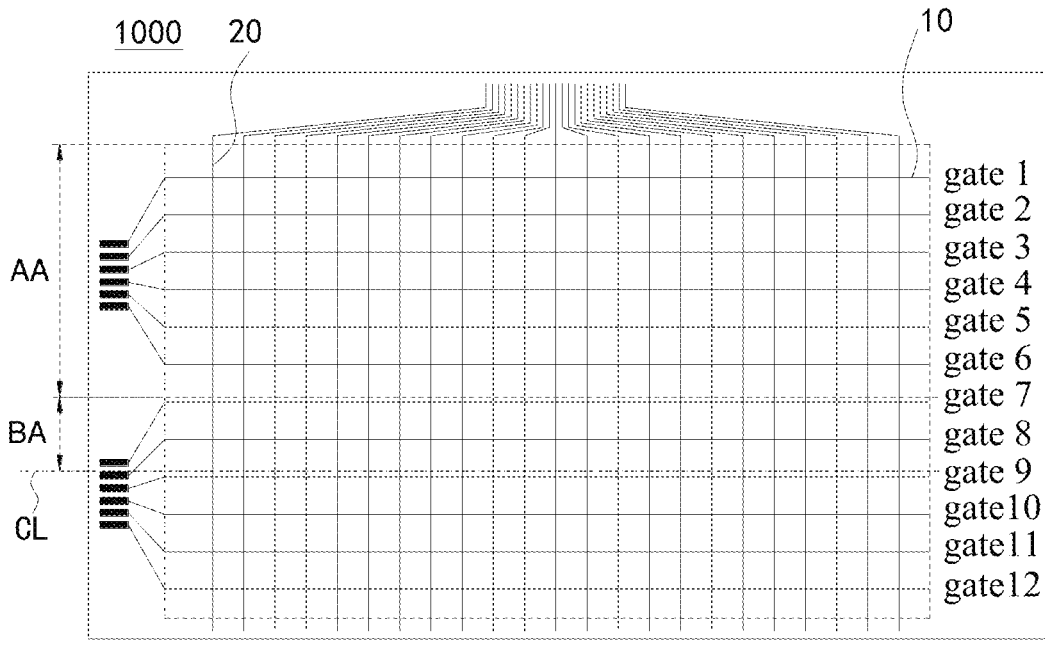
FIG. 1 is a schematic view of a wiring structure of a conventional display panel before cutting the conventional display panel.
FIG. 2 is a schematic view of a partial plane structure of a sub-display panel after cutting the display panel in FIG. 1.

Please refer to FIGS. 1 and 2. FIG. 1 is a schematic view of a wiring structure of a conventional display panel before cutting/segmentation of the conventional display panel. FIG. 2 is a schematic view of a partial plane structure of a sub-display panel after cutting/segmentation of the display panel in FIG. 1. In conventional techniques, the display panel 1000 includes a plurality of gate lines 10 and a plurality of data lines 20, gate drivers are electrically connected to the gate lines 10 to drive pixels to emit light. When the display panel 1000 is not cut, all the gate lines 10 can operate normally. As shown in FIG. 1, the display panel includes 12 gate lines and two gate drivers as an example. A first gate driver is electrically connected to six first gate lines, namely gate 1 to gate 6, and a second gate driver is electrically connected to six second gate lines, specifically gate 7 to gate 12.

As shown in FIG. 1, when cutting the display panel 1000 to form a new sub-display panel 100, a certain distance is required between a cutting line CL and a boundary of a new display area AA. The boundary of the new display area AA is at the 6th first gate line gate 6. Thus, after cutting, the second gate lines gate 7 and gate 8 between the sixth first gate line gate 6 and the cutting line CL are disconnected from the second gate driver, and the second gate lines gate 7 and gate 8 become floating gate lines. A region between the sixth first gate line gate 6 and the cutting line CL becomes a new border region BA, as shown in FIG. 2.

As shown in FIG. 2, due to the presence of the floating gate lines (gate 7 and gate 8) in the border region BA, a pixel thin-film transistor T1 is in a slightly turned-on state (weakly open state) when not powered, and writing a signal from the data line 20 causes a sub-pixel 30 in the border region to emit light, thereby resulting light leakage in the border region.

Referring to FIGS. 3 to 11, to address the above defects, the present application provides a display panel 100.

The display panel 100 includes a first display region 101 and a first border region 102A adjacent to the first display region. The display panel 100 includes a plurality of sub-pixels 30, a plurality of pixel driving circuits 40, and a plurality of gate lines 10. The sub-pixels 30 include a plurality of first sub-pixels 31 distributed in the first display region 101 and a plurality of second sub-pixels 32 distributed in the first border region 102A. The pixel driving circuits 40 include a plurality of first pixel driving circuits 41 distributed in the first display region 101 and electrically connected to the first sub-pixels 31 and a plurality of second pixel driving circuits 42 distributed in the first border region 102A and electrically connected to the second sub-pixels 32. The gate lines 10 include a plurality of first gate lines 11 arranged in the first display region 101 and at least one second gate line 12 arranged in the first border region 102A. Each of the second gate lines 12 is electrically connected between a gate driver 60 and the corresponding first pixel driving circuit 41, and the at least one second gate line 12 is electrically connected to the corresponding second pixel driving circuit 42. The display panel further includes a power control unit 50. The power control unit 50 includes a power line 51, and the power line 51 is electrically connected to the at least one second gate line 12.

In the present application, by adding to the display panel the power control unit 50 which includes the power line 51, the power line 51 is electrically connected to the second gate line 12 arranged in the first border region 102A. Hence, a first power supply voltage can be transmitted to the second gate line 12 arranged in the first border region 102A through the power line 51 to control the second pixel driving circuit 42 electrically connected to the corresponding second gate line 12 to be in a disconnected state. That is, controlling the corresponding second sub-pixel to be in a non-luminating state to prevent light leakage in the first border region 102A.

The technical solutions of the present application are described in detail below with specific embodiments.

Figure 3:
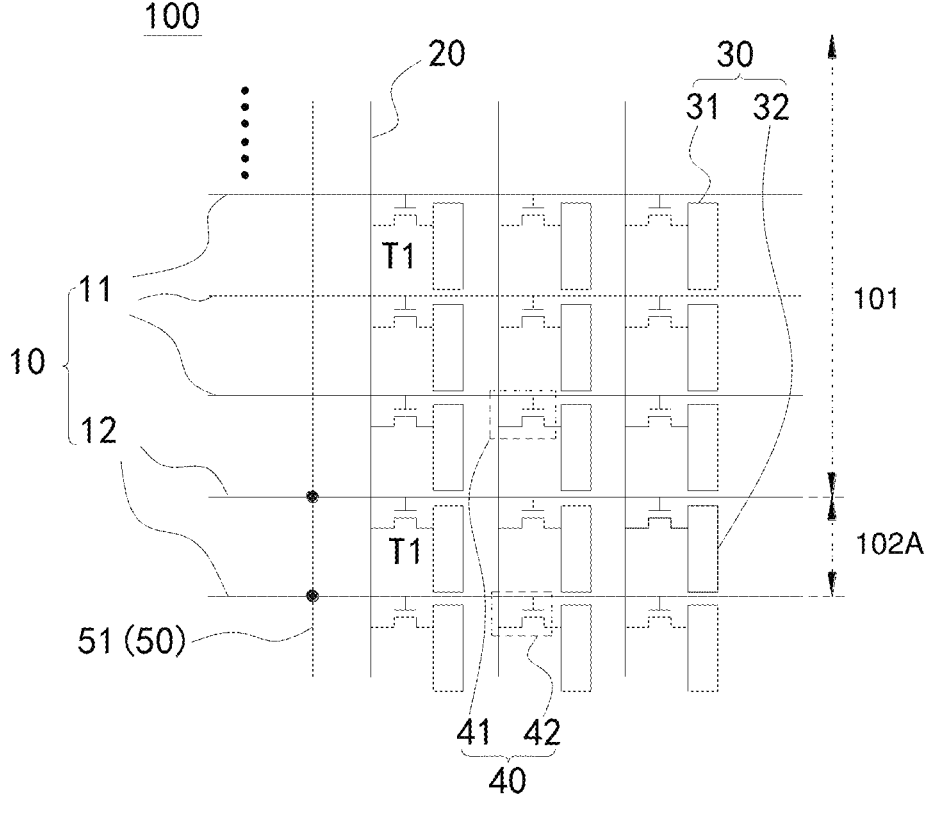
FIG. 3 is a schematic view of a first plane structure of the display panel according to one embodiment of the present application.
Figure 4:
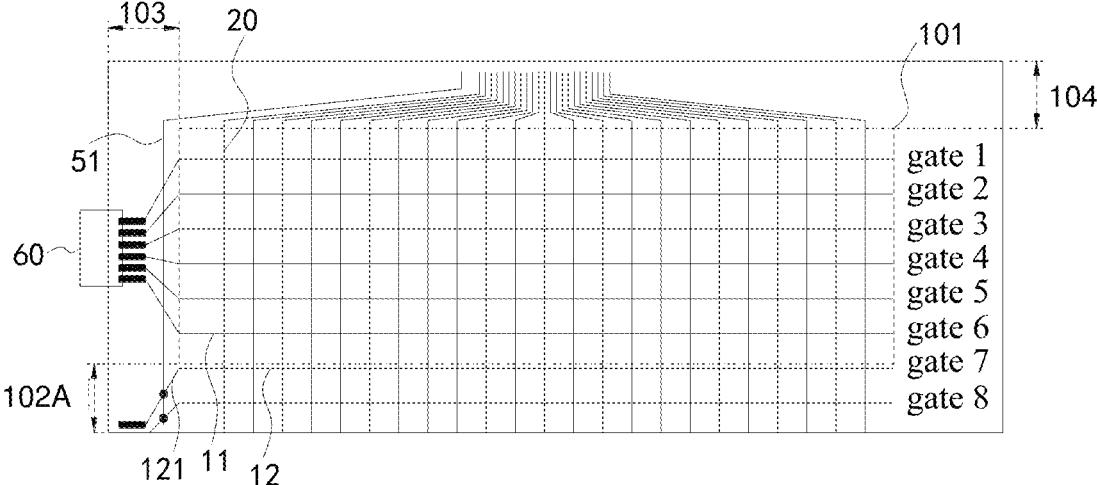
FIG. 4 is a schematic view of a first wiring structure of the display panel according to one embodiment of the present application.

Please refer to FIGS. 3 and 4. FIG. 3 is a schematic view of a first plane structure of the display panel according to one embodiment of the present application. FIG. 4 is a schematic view of a first wiring structure of the display panel according to one embodiment of the present application.

As shown in FIG. 3, the display panel 100 of the present embodiment includes a first display region 101 and a first border region 102A adjacent to the first display region. The display panel 100 includes a plurality of sub-pixels 30, a plurality of pixel driving circuits 40, and a plurality of gate lines 10. The display panel 100 can be a liquid crystal display panel or an OLED display panel. In this embodiment, the liquid crystal display panel is taken as an example for illustration.

The sub-pixels 30 include a plurality of first sub-pixels 31 distributed in the first display region 101 and a plurality of second sub-pixels 32 distributed in the first border region 102A. The pixel driving circuits 40 include a plurality of first pixel driving circuits 41 distributed in the first display region 101 and electrically connected to the plurality of first sub-pixels 31, and include a plurality of second pixel driving circuits 42 distributed in the first border region 102A and electrically connected to the plurality of second sub-pixels 32. The gate lines 10 include a plurality of first gate lines 11 arranged in the first display region 101 and at least one second gate line 12 arranged in the first border region 102A. Each of the first gate line 12 is electrically connected between a gate driver 60 and the corresponding first pixel driving circuit 41. The at least one second gate line 12 is electrically connected to the corresponding second pixel driving circuits 42. The display panel further includes a power control unit 50, the power control unit 50 includes a power line 51, and the power line 51 is electrically connected to the at least one second gate line 12.

The power line 51 is configured to transmit a first power supply voltage to the at least one second gate line 12 to control the corresponding second sub-pixels 32 in a non-illuminating state so as to prevent light leakage from the first border region 102A.

Specifically, the display panel 100 further includes a plurality of data lines 20. The data lines 20 intersect with the scan lines 10 to define a plurality of sub-pixel regions. The sub-pixels 30 are arranged in a one-to-one correspondence with the sub-pixel regions. The data line 20 is electrically connected to the corresponding first pixel driving circuit 41 and the corresponding second pixel driving circuit 42, so that data signals are written into the corresponding first sub-pixel 31 or the corresponding second sub-pixel 32.

Specifically, the first pixel driving circuit 41 and the second pixel driving circuit 42 both include a pixel transistor T1. The pixel transistor T1 includes a gate, a source, and a drain. The gate of the pixel transistor T1 is electrically connected to the corresponding gate line 10, one of the source and the drain of the pixel transistor T1 is electrically connected to the corresponding data line 20, and the other one of the source and the drain of the pixel transistor T1 is electrically connected to the corresponding sub-pixel 30.

The pixel transistor T1 of the present embodiment is an amorphous silicon thin-film transistor. In other embodiments, the pixel transistor T1 can also be a metal oxide transistor (such as an IGZO transistor) or a polycrystalline silicon transistor.

The pixel transistor T1 can be an N-type transistor or a P-type transistor. A first power supply voltage is set to a cutoff voltage of the pixel transistor T1 to control the control pixel transistor T1 to be in a disconnected state. Different first power supply voltages can be set based on different options for the pixel transistor T1. The pixel transistor T1 of the present embodiment takes the N-type transistor as an example for illustration. The first power supply voltage can be set to a low potential voltage, causing the pixel transistor T1 in the first border region 102A to be in the disconnected state. As a result, data signals are not written, and the corresponding second sub-pixel 32 remains in a black state without emitting light, thereby solving the problem of light leakage in the first border region 102A. The first power supply voltage can be set as a constant DC voltage or an AC voltage within a range of −5V to −15V. Specifically, it can be a DC voltage of −6V, −8V, −10V, or −12V.

The present embodiment takes the example of having two second gate lines 12 in the first border region 102A for illustration. The power line 51 is electrically connected to the two second gate lines 12. It should be understood that if there are more second gate lines 12 in the second border region 102A, the power line 51 should be electrically connected to all of the second gate lines 12 to ensure that all second sub-pixels 32 electrically connected to the second gate lines 12 are in a black state.

Please refer to FIG. 4. The first gate lines 11 in the first display region 101 can be connected to a same gate driver 60. It should be noted that the first gate lines 11 may also be connected to two or more different gate drivers 60 in different regions, and the present application is not limited in this regard.

In the present embodiment, the first gate lines 11 and the second gate lines 12 are arranged parallelly in the same layer, and the power line 51 is disposed in a different layer from the first gate lines 11 and the second gate lines 12. The first gate line 11 and the second gate line 12 can be obtained by patterning the same film layer.

Further, the power line 51 can be disposed in the same layer as the data line 20. Furthermore, the power line 51 can be disposed parallel to the data line 20. The power line 51 can be obtained with the data line 20 by the same patterning process.

Figure 5:
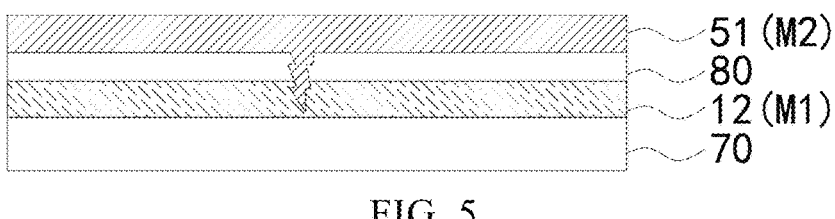
FIG. 5 is a schematic view of a first partial film layer stacked structure of the display panel according to one embodiment of the present application.

As shown in FIG. 5, FIG. 5 is a schematic view of a first partial film layer stacked structure of the display panel according to one embodiment of the present application. Specifically, the display panel further includes a substrate 70, a first metal layer M1 disposed on the substrate 70, an insulation layer 80 disposed on the first metal layer M1, and a second metal layer M2 disposed on the insulation layer 80. The first metal layer M1 at least includes the first gate lines 11 and the second gate lines 12. The second metal layer M2 includes the data lines 20 electrically connected to the first pixel driving circuits 41 and the second pixel driving circuits 42 and includes the power line 51.

The power line 51 connects and contacts the second gate line 12 through the insulation layer 80, so as to realize an electrical connection between the power line 51 and the second gate line 12. The power line 51 directly transmits the first power supply voltage to the second gate line 12.

The power line 51 can contact the second gate line 12 by means of laser technology. Specifically, the display panel 100 is obtained from a display panel to be cut (hereinafter referred to as an original display panel), so during the fabrication of the original display panel, the power line 51 can be initially produced without being electrically connected to the second gate line 12, thereby avoiding signal interference from the second gate line to the original display panel. When the original display panel needs to be cut and used, after obtaining the display panel 100 of this embodiment through cutting, laser irradiation can then be applied to establish contact and connection between the power line 51 and the second gate line 12.

As shown in FIG. 4, the display panel 100 further includes a second border region 103 adjacent to the first border region 102A and the first display region 101. The power line 51 is arranged in the second border region 103. On one hand, this arrangement prevents the power line 51 from occupying the space in the first display region 101, thereby avoiding any impact on a pixel aperture ratio of the first display region 101. On the other hand, this arrangement prevents the occurrence of parasitic capacitance between the power line 51 and the first gate line 11 in the first display region 101.

Further, the display panel 100 further includes a third border region 104 opposite the second border region 103. The third border region 104 includes a first terminal region and a first fan-out region. The first fan-out region is arranged with a plurality of first fan-out lines, one end of the first terminal region is electrically connected to a source driver (not illustrated), and another end of the first terminal region is electrically connected to the data lines 20 of the first display region 101 through the respective corresponding first fan-out lines. The power line 51 can be electrically connected to a power controller by electrically connecting the corresponding first fan-out line of the first fan-out region.

Please refer to FIGS. 4 and 5. Further, the second border region 103 is provided with a second terminal region and a second fan-out region. The gate line 10 includes a fan-out section arranged in the second fan-out region. One end of the second terminal region is electrically connected to the gate driver 60, and another end of the second terminal region is electrically connected to the fan-out section of the first gate line 11. The second gate line 12 is a floating gate line (referring to the description of FIGS. 1 and 2), the second gate line 12 and the gate driver 60 are electrically insulated from each other. Thus, the fan-out section of the second gate line 12 is not electrically connected to any gate driver 60. The power line 51 is electrically connected to the fan-out section of the second gate line 12 through the insulation layer 80 below the power line 51.

Figure 6:
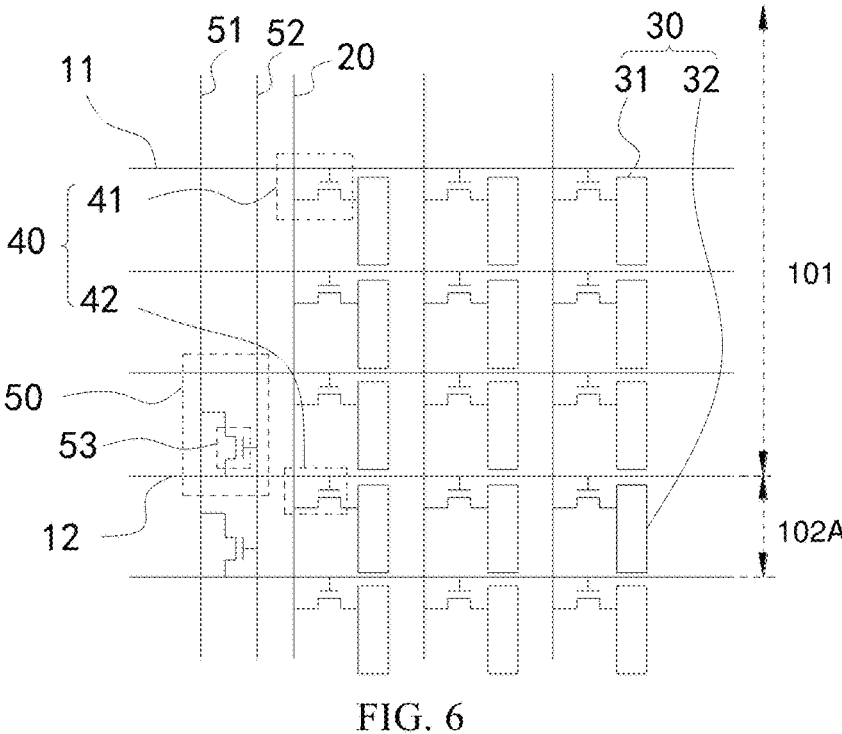
FIG. 6 is a schematic view of a second plane structure of the display panel according to one embodiment of the present application.

Please refer to FIG. 6. FIG. 6 is a schematic view of a second plane structure of the display panel according to one embodiment of the present application.

As shown in FIG. 6, the structure of the present embodiment differs from the structure of the display panel shown in FIG. 3 in that the power control unit 50 further includes a switching transistor 53 and a control signal line 52. Specifically, a gate of the switching transistor 53 is electrically connected to the control signal line 52, one of a source and a drain of the switching transistor 53 is electrically connected to the power line 51, and the other one of the source and the drain of the switching transistor 53 is electrically connected to the corresponding second gate line 12. A first control signal is transmitted through the control signal line 52 to control the switching transistor 53 to be in a turned-one state (open state), the first power supply voltage signal of the power line 51 is written to control the corresponding second sub-pixels 32 to be in the non-luminating state to prevent the occurrence of light leakage in the first border region 102A.

It is worth noting that, in the present embodiment, each switching transistor 53 electrically connects one of the second gate lines 12, and multiple switching transistors 53 can be electrically connected to the same power line 51 and the same control signal line 52. That is to say, the switching transistors 53 can share one power line 51 and one control signal line 52.

The switching transistor 53 of the present embodiment is an amorphous silicon thin-film transistor, and in other embodiments, the switching transistor 53 can also be a metal oxide transistor (such as IGZO type transistor) or a polycrystalline silicon transistor.

The switching transistor 53 can be an N-type transistor or a P-type transistor. The first control signal is a voltage signal that causes the switching transistor 53 to turn on, and the first power supply voltage is set to a cut-off voltage of the pixel transistor T1. In this embodiment, the explanation is provided using an N-type transistor as the switching transistor 53. The control signal line 52 is at a high potential voltage, causing the switching transistor 53 to be in the turned-on state. This results in conduction between the source and the drain of the switching transistor 53, allowing the first power supply voltage to be written. At this point, the voltage on the connected second gate line 12 is the same as the first power supply voltage. The pixel transistor T1 is turned off, preventing data signals from being written, and the corresponding second sub-pixel remains in a black state without emitting light.

Specifically, a high potential voltage of the control signal line 52 can be a direct current (DC) voltage greater than 28V or an alternating current (AC) voltage. The first power supply voltage can be a constant DC voltage within the range of −5V to −15V or AC voltage. Specifically, the high potential voltage of the control signal line 52 can be a DC voltage of 30V, 32V, 35V, or 40V, and the first power supply voltage can be a DC voltage of −6V, −8V, −10V or −12V.

The control signal line 52 can be arranged in the same layer and made of the same material as the power line 51. That is to say, the control signal line 52 can be obtained with the power line 51 by patterning the same film layer, thereby streamlining the manufacturing process and reducing the overall thickness of the display panel 100.

Figure 7:
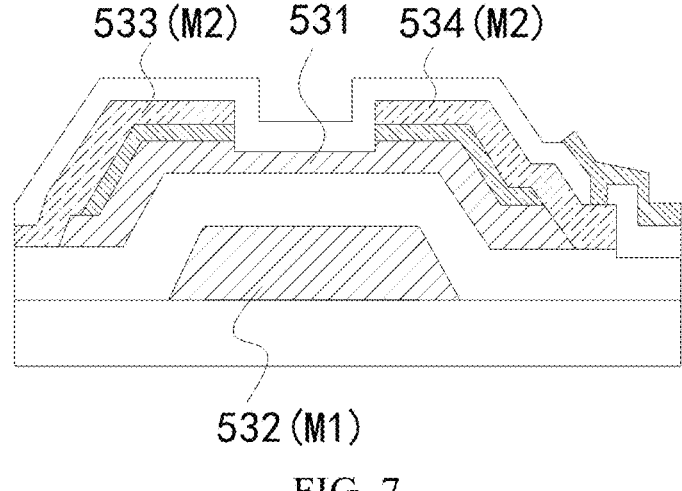
FIG. 7 is a schematic view of a second partial film layer stacked structure of the display panel according to one embodiment of the present application.

Specifically, as shown in FIG. 7, FIG. 7 is a schematic view of a second partial film layer stacked structure of the display panel according to one embodiment of the present application. The first metal layer M1, in addition to including the first gate lines and the second gate lines, can also include a gate 532 of the switching transistor 53 and the gate of the pixel transistor T1. For the purpose of distinction, the gate 532 of the switching transistor 53 is referred to as the first gate 532, and the gate of the pixel transistor T1 is referred to as the second gate. The second metal layer M2, in addition to including the data line 20 and the power line 51, can also include the control signal line 52, a source 533 and a drain 534 the switching transistor 53, as well as the source and the drain of the pixel transistor T1. The display panel further includes a semiconductor layer disposed between the first metal layer M1 and the second metal layer M2. The semiconductor layer includes an active layer 531 of the switching transistor 531 and an active layer of the pixel transistor. Therefore, the technical solution provided by the present embodiment does not require additional masks in the photolithography process and does not cause an increase in film layer thickness. The present embodiment only requires preserving corresponding patterns in the corresponding positions based on the original patterning process.

It can be understood that there are insulating layers between each pair of the first metal layer M1, the semiconductor layer, and the second metal layer M2 to provide isolation.

Figure 8:
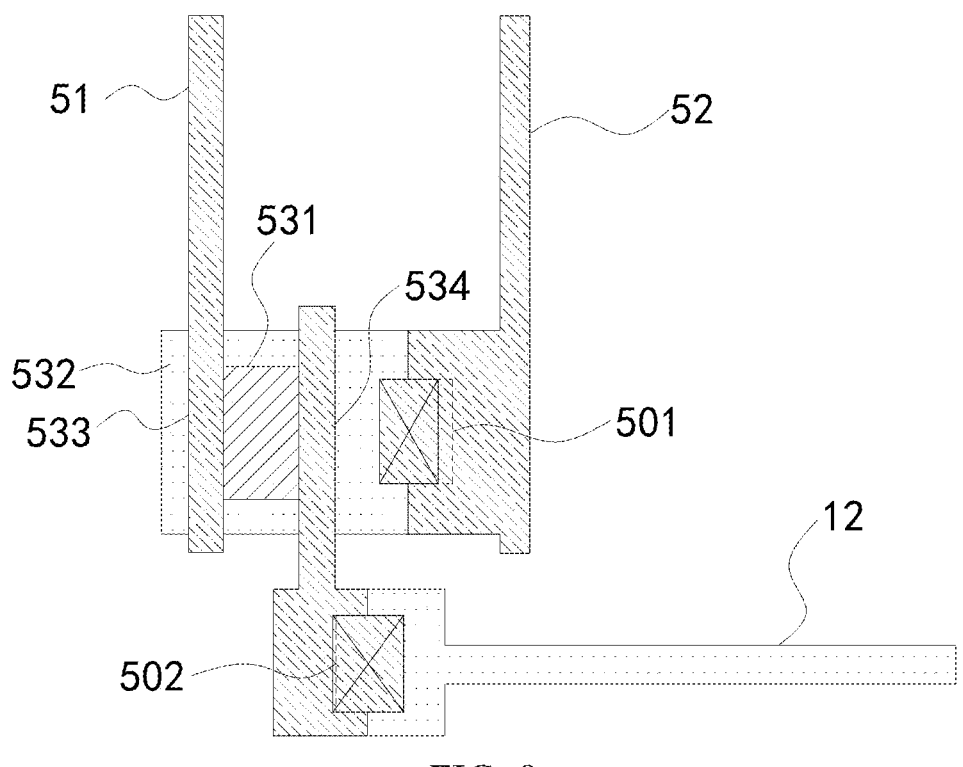
FIG. 8 is a schematic plane view of an electrical connection between a power control unit and a second gate line according to one embodiment of the present application.

Please refer to FIG. 8. FIG. 8 is a schematic view of an electrical connection between the power control unit and the second gate line according to one embodiment of the present application. The control signal line 52 is electrically connected to the first gate 532 of the switching transistor 532 through a corresponding first via hole 501. The power line 51 is disposed in the same layer as the source 533 and the drain 534 of the switching transistor 53, so that the power line 51 is directly connected to one of the source 533 and the drain 534 of the switching transistor 53, and the other one of the source 533 and the drain 534 of the switching transistor 534 is electrically connected to the corresponding second gate line 12 through a corresponding second via hole 502.

Figure 9:
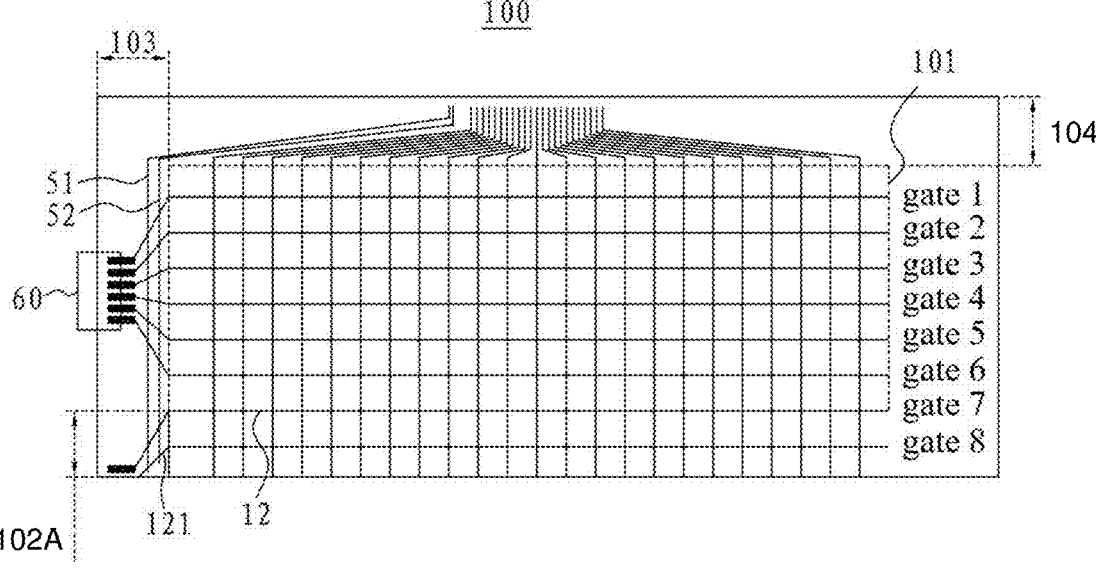
FIG. 9 is a schematic view of a second wiring structure of the display panel according to one embodiment of the present application.

Please refer to FIG. 9. FIG. 9 is a schematic view of a second wiring structure of the display panel according to one embodiment of the present application. The power line 51 and the control signal line 52 are arranged in the second border region 103. The switching transistor 53 can be disposed in the second frame region 103, thus preventing any impact on an aperture ratio of the first display region 101.

Since the gate driver is usually electrically connected to multiple gate lines, an area occupied by the gate lines is much larger than an area occupied by the gate driver electrically connected to the gate lines, so the corresponding fan-out sections can be provided in the second border region 103 to provide a transitional connection between the gate driver and the gate lines arranged in the display area. The fan-out sections electrically connected to the same gate driver are collectively arranged in a fan shape, and an angle between each fanout section and the corresponding gate line in the display area is an obtuse angle. As known from the conventional techniques mentioned above, it can be seen that, due to the cutting process, the electrical connection between the second gate line 12 and the corresponding gate driver is cut off, the corresponding gate driver is removed, leaving only the fan-out section. Therefore, as shown in FIG. 9, the second gate line 12 of the display panel 100 of the present embodiment includes a fan-out section 121 arranged in the second border region 103, and a straight section 122 extending the first border region 102A. The fan-out section 121 is in contact with the straight section 122. The fan-out section 121 is an oblique line section, and an angle between the fan-out section 121 and the straight line section 122 is an obtuse angle. The other one of the source 533 and the drain 534 of the switching transistor 53 is electrically connected to the corresponding fan-out section 121 via the corresponding second via 502. Compared to a via connection with the straight section 122, this approach avoids excessive wiring design and avoid occupying a pixel aperture space in the first border region 102A, which is utilized as a display area before cutting.

The wiring arrangement of the control signal line 52 is the same or similar to the wiring arrangement of the power line 51. The control signal line 52 is electrically connected to the corresponding first fan-out lines in the third border region 104 to be electrically connected to the power controller.

Figure 10:
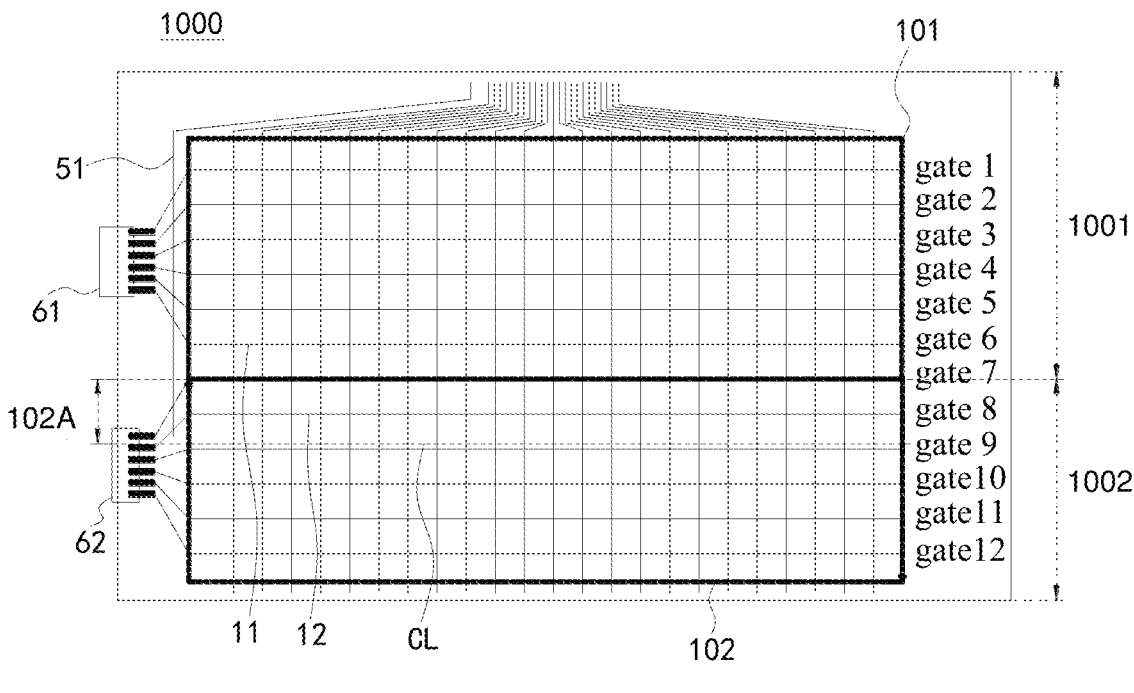
FIG. 10 is a schematic view of a first wiring layout of a display panel to be cut according to one embodiment of the present application.
Figure 11:
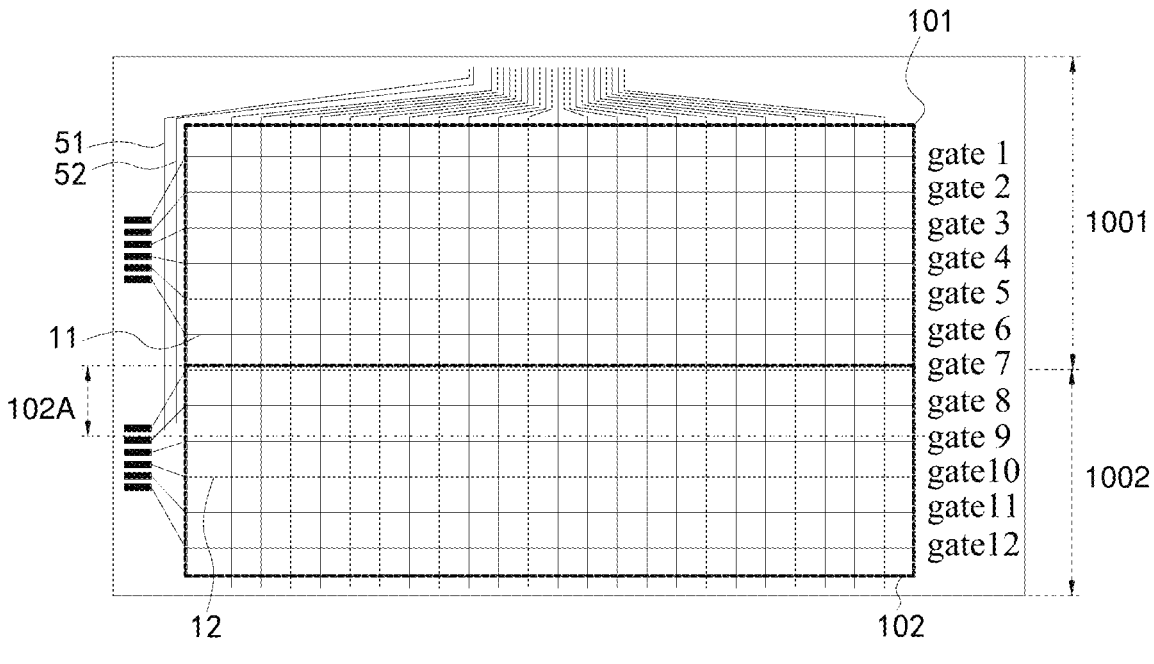
FIG. 11 is a schematic view of a second wiring layout of the display panel to be cut according to one embodiment of the present application.

Referring to FIGS. 10 and 11, the present application further provides a display panel 1000 according to one embodiment. The display panel 100 in the above embodiment can be obtained by cutting the display panel 1000.

As shown in FIGS. 3, 6, 10 and 11, the display panel 1000 includes a first region 1001 and a second region 1002 adjacent to each other. The first region 1001 includes a first display region 101. The second region 1002 includes a second display region 102 adjacent to the first display region 101.

The display panel 1000 includes a plurality of sub-pixels 30, a plurality of pixel driving circuits 40, and a plurality of gate lines 10. The sub-pixels 30 include a plurality of first sub-pixels 31 distributed in the first display region 101 and a plurality of second sub-pixels 32 distributed in the second display region 102. The pixel driving circuits 40 include a plurality of first pixel driving circuits 41 distributed in the first display region 101 and electrically connected to a plurality of first sub-pixels 31, and include a plurality of second pixel driving circuits 42 distributed in the second display region 102 and electrically connected to a plurality of second sub-pixels 32. The gate lines 10 include a plurality of first gate lines 11 arranged in the first display region 101 and a plurality of second gate lines 12 arranged in the second display region 102. Each of gate line 10 is electrically connected between the first gate driver 61 and the corresponding first pixel driving circuit 41. Each second gate line 12 is electrically connected between the second gate driver 62 and the corresponding second pixel driving circuit 42.

The display panel 1000 further includes a power control unit 50. The power control unit 50 includes a power line 51. The power line 51 extends from the first region 1001 to at least one of the second gate lines 12 arranged in the second region 1002 and close to the first gate lines 11.

The power line 51 extends to at least one of the second gate lines 12 arranged in the second region 1002 and close to the first gate lines 11. This means that in the thickness direction of the display panel 1000, one end of the power line 51 away from the first region 1001 overlaps with at least one of the second gate lines 12 arranged in the second region 1002 and close to the first gate lines 11.

In the present application, the power control unit 50 having the power line 51 is added in the structure of the display panel 1000, the power line 51 extends from the first region 1001 to at least one of the second gate lines 12 of the second region 1002 close to the first gate lines 11, so as to facilitate subsequent cutting of the display panel 1000 to form a smaller-size display panel 100. The first power supply voltage is transmitted to the remaining second gate line 12 via the power line 51 to control the second sub-pixels 32 in the newly formed first border region 102A to be in a non-luminating state, thus preventing occurrence of light leakage of the display panel 100 formed by cutting. In addition, when the display panel 1000 is not cut for use, the power control unit does not have a negative impact on the performance of the display panel 1000.

Referring to FIG. 10, FIG. 10 is a schematic view of a first wiring layout of a display panel to be cut, as provided in the present application.

The display panel 1000 includes a first region 1001 and a second region 1002 adjacent to each other. The first region 1001 includes a first display region 101. The second region 1002 includes a second display region 102 adjacent to the first display region 101.

The display panel 1000 includes a plurality of sub-pixels 30, a plurality of pixel driving circuits 40, and a plurality of gate lines 10. The sub-pixels 30 include a plurality of first sub-pixels 31 distributed in the first display region 101 and a plurality of second sub-pixels 32 distributed in the second display region 102. The pixel driving circuits 40 include a plurality of first pixel driving circuits 41 distributed in the first display region 101 and electrically connected to the first sub-pixels 31, and include a plurality of second pixel driving circuits 42 distributed in the second display region 102 and electrically connected to the second sub-pixels 32. The gate lines 10 include a plurality of first gate lines 11 arranged in the first display region 101 and a plurality of second gate lines 12 arranged in the second display region 102. Each first gate line 11 is electrically connected between the first gate driver 61 and the corresponding first pixel driving circuit 41. Each second gate line 12 is electrically connected between the second gate driver 62 and the corresponding second pixel driving circuit 42.

The display panel 1000 further includes a power control unit 50. The power control unit 50 includes a power line 51. The power line 51 extends from the first region 1001 to at least one of the second gate lines 12 arranged in the second region 1002 and close to the first gate lines 11.

The power line 51 extends to at least one of the second gate lines 12 arranged in the second region 1002 and close to the first gate lines 11. This means that in the thickness direction of the display panel 1000, one end of the power line 51 away from the first region 1001 overlaps with at least one of the second gate lines 12 arranged in the second region 1002 and close to the first gate lines 11.

As shown in FIG. 10, the present embodiment takes an example of including two gate drivers and 10 gate lines. The first gate lines, namely gate 1 to gate 6, are electrically connected to the first gate driver 61. The second gate lines, namely gate 7 to gate 12, are electrically connected to the second gate driver 62. Since the cutting line CL needs to maintain a certain distance from the display area (corresponding to the first display region 101) of the display panel 100 formed after cutting, the cutting line CL needs to be positioned in the second display region 102 and at a certain distance from the first display region 101. An area between the cutting line CL and a boundary of the first display region 101 forms a new border region 102A (referred to as the first border region 102A in the aforementioned embodiment) for the smaller-sized display panel 100. The first pixel driving circuit 41 and the second pixel driving circuit 42 both include a pixel transistor T1. The pixel transistor T1 includes a gate, a source, and a drain. The gate of the pixel transistor T1 is electrically connected to the corresponding gate line 10, one of the source and the drain of the pixel transistor T1 is electrically connected to the corresponding data line 20, and the other one of the source and the drain of the pixel transistor T1 is electrically connected to the corresponding sub-pixel 30.

After cutting, certain portions of the second gate lines 12 (such as gate 7, gate 8) in the second display region 102 are retained. However, due to this cutting process, the second gate lines 12 are disconnected from their original connection to the second gate driver 62. Consequently, the second gate lines 12 become floating gate lines. The characteristics of the floating gate lines, along with the properties of the pixel transistors, cause the pixel transistors to be in a slightly turned-on state (weakly open state) even when not powered. This results in light emission of the sub-pixels electrically connected to the second gate lines 12 in the new border region 102A, causing light leakage.

Accordingly, the present embodiment adds a power line 51 extending from the first region 1001 to the second region 1002, and extends to at least one of the second gate lines 12 close to the first region 1001, an extension end of the power line 51 is determined based on the specific position of the cutting line CL. It is necessary to ensure that the power line 51 overlaps all the second gate lines 12 in the subsequently formed new border region 102A. This allows for, after the subsequent completion of cutting, a laser process is carried out on the power line of the new display panel 100 to establish electrical connection between the power line 51 and the corresponding second gate line 12. Thereby, the first power supply voltage can be transmitted to the second gate line 12 to control the corresponding sub-pixels to be in a non-illuminating state, thus preventing occurrence of light leakage in the border region 102A.

Specifically, in the present embodiment, the power line 51 is electrically insulated from at least one of the second gate lines 12 close to the first gate lines 11. This insulation is implemented to prevent any negative impacts on the normal signal transmission between the power line 51 and the second gate line 12 when the display panel 1000 is used as an uncut screen.

When the display panel 1000 needs to be further cut into a smaller-sized display panel 100 for use, after cutting the display panel 1000 to create the smaller-sized display panel, the power line 51 and the corresponding second gate lines 12 can be electrically connected by laser irradiation.

Other structural details of the display panel 1000 of the present embodiment are similar or identical to the structural details of the display panel 100 in the aforementioned embodiment. Please refer to the description of the foregoing embodiment for the specific details, and a detailed description thereof is not repeated herein.

Referring to FIG. 11. FIG. 11 is a schematic view of a second wiring layout of the display panel to be cut according to one embodiment of the present application.

The structure of the display panel to be cut shown in FIG. 10 differs in that the power control unit of the present embodiment further includes a switching transistor 53 and a control signal line 52, a gate of the switching transistor 53 is electrically connected to the control signal line 52, one of the source and the drain of the switching transistor 53 is electrically connected to the power line 51, and the other one of the source and the drain of the switching transistor 53 is electrically connected to the corresponding second gate line 12, as shown in FIG. 6.

It should be understood that the switching transistor 53 only needs to be electrically connected to the second gate line 12 arranged in an area (i.e., the first border region 102A) between the first display region 101 and the cutting line CL, and may be not electrically connected to other second gate lines 12. Each second gate line 12 in the first border region 102A can be provided with one switching transistor 53 correspondingly.

Other structural details of the display panel 1000 of the present embodiment are similar or identical to the structural details of the display panel 100 in the aforementioned embodiment. Please refer to the description of the foregoing embodiment for the details, and a description thereof is not repeated herein.

The control signal line 52 controls the switching transistor 53 to be in a turned-on state or in a turned-off state. When the display panel 1000 is used as an uncut screen, the control signal line 52 is in a low potential voltage (less than −6V), the switching transistor 53 is turned off, the power line 51 is disconnected from the corresponding second gate line 12, data signals can be written normally, and the corresponding second sub-pixels 32 can emit light normally. Accordingly, the sub-pixels in the first border region 102A emit light without being affected by the power control unit 50.

When the display panel 1000 needs to be further cut into a smaller-sized display panel 100 for use, the control signal line 52 is at a high potential voltage (greater than 28V), causing the switching transistor 53 to be turned on. The power line 51 is electrically connected to the corresponding second gate line 12. Data signals are not written, and the corresponding second sub-pixels 32 remains in a black state without emitting light, thus preventing occurrence of light leakage in the first border region 102A.

In summary, the display panel 100 of the present application includes a first display region 101 and a first border region 102A adjacent to the first display region 101. The display panel 100 includes a plurality of sub-pixels 30, a plurality of pixel driving circuits 40, a plurality of gate lines 10, and a power control unit. The sub-pixels 30 include a plurality of first sub-pixels 31 distributed in the first display region 101 and a plurality of second sub-pixels 32 distributed in the first border region 102A. The pixel driving circuits 40 include a plurality of first pixel driving circuits 41 distributed in the first display region 101 and electrically connected to the first sub-pixels 31, and include a plurality of second pixel driving circuits 42 distributed in the first border region 102A and electrically connected to the second sub-pixels 32. The gate lines 10 include a plurality of first gate lines 11 arranged in the first display region 101 and at least one second gate line 12 arranged in the first border region 102A. Each of the first gate lines 12 is electrically connected between a gate driver 60 and the corresponding first pixel driving circuit 41. At least one of the second gate lines 12 is electrically connected to the corresponding second pixel driving circuit 42. The power control unit 50 includes a power line 51. The power line 51 is electrically connected to at least one of the second gate lines 12. By transmitting a first power supply voltage to the second gate line 12 of the first border region 102A through the power line 51, the corresponding second sub-pixels are controlled to be in a non-luminating state, thus preventing occurrence of light leakage in the first border region 102A.

In the above embodiments, the description of each embodiment has its own emphasis, and for those that are not described in detail in one embodiment, reference may be made to relevant description in other embodiments.

The display panel of the present invention is described in detail with reference to specific embodiments. The principles and embodiments of the present invention are elaborated in conjunction with specific examples in this disclosure. The description of the above embodiments is only used for ease of understanding the technical solution and main ideas of the present invention. Those of ordinary skill in the art should understand that they can still modify the technical solutions described in the aforementioned embodiments, or replace some of the technical features equivalently. These modifications or replacements do not deviate the essence of the corresponding technical solutions and should be deemed to fall within the protection scope of the technical solutions of the embodiments of the present invention.

What is claimed is:

1. A display panel, comprising a first display region and a first border region adjacent to the first display region, the display panel comprising:

a plurality of sub-pixels, comprising a plurality of first sub-pixels distributed in the first display region and a plurality of second sub-pixels distributed in the first border region;

a plurality of pixel driving circuits, comprising a plurality of first pixel driving circuits distributed in the first display region and electrically connected to the first sub-pixels and a plurality of second pixel driving circuits distributed in the first border region and electrically connected to the second sub-pixels;

a plurality of gate lines, comprising a plurality of first gate lines arranged in the first display region and at least one second gate lines arranged in the first border region, wherein each of the first gate lines is electrically connected to one gate driver and the corresponding first pixel driving circuit, and the at least one second gate line is electrically connected to the corresponding second pixel driving circuits; and a power control unit, comprising a power line electrically connected to the at least one second gate line, wherein the power line transmits a first power supply voltage to the at least one second gate line to control the second pixel driving circuits electrically connected to the at least one second gate line to be in a disconnected state, wherein the power control unit further comprises a switching transistor and a control signal line, a gate of the switching transistor is electrically connected to the control signal line, one of a source and a drain of the switching transistor is electrically connected to the power line, and the other one of the source and the drain of the switching transistor is electrically connected to the corresponding second gate line.

2. The display panel according to claim 1, wherein the at least one second gate line is electrically insulated from the gate driver.

3. The display panel according to claim 1, further comprising:

a first metal layer, comprising the first gate lines and the at least one second gate line;

an insulation layer disposed on the first metal layer; and a second metal layer, disposed on the insulation layer and comprising a plurality of data lines, electrically connected to the first pixel driving circuits and the second pixel driving circuits, and the power line.

4. The display panel according to claim 3, wherein the power line connects and contacts the at least one second gate line through the insulation layer.

5. The display panel according to claim 4, further comprising a second border region adjacent to the first border region and the first display region, wherein the power line is arranged in the second border region.

6. The display panel according to claim 1, wherein the control signal line is disposed in a same layer and made of a same material as the power line.

7. The display panel according to claim 1, further comprising a second border region adjacent to the first border region and the first display region, wherein the power line and the control signal line are arranged in the second border region.

8. The display panel according to claim 7, wherein the gate of the switching transistor is connected to the control signal line through a via hole.

9. The display panel according to claim 8, wherein each of the at least one second gate line comprises a fan-out section arranged in the second border region, and the other one of the source and the drain of the switching transistor is connected to the corresponding fan-out section through a via hole.

10. The display panel according to claim 6, further comprising:

a first metal layer, comprising the first gate lines, the at least one second gate line, and the gate of the switching transistor;

a semiconductor layer, disposed above the first metal layer and comprising an active layer of the switching transistor; and a second metal layer disposed on the semiconductor layer, the second metal layer comprising a plurality of data lines electrically connected to the first pixel driving circuits and the second pixel driving circuits, the power line, the control signal line, and the source and the drain of the switching transistor.

11. A display panel, comprising a first region and a second region adjacent to the first region, the first region comprising a first display region, the second region comprising a second display region adjacent to the first display region, the display panel comprising:

a plurality of sub-pixels, comprising a plurality of first sub-pixels distributed in the first display region and a plurality of second sub-pixels distributed in the second display region;

a plurality of pixel driving circuits, comprising a plurality of first pixel driving circuits distributed in the first display region and electrically connected to the first sub-pixels and a plurality of second pixel driving circuits distributed in the second display region and electrically connected to the second sub-pixels;

a plurality of gate lines, comprising a plurality of first gate lines arranged in the first display region and a plurality of second gate lines arranged in the second display region, wherein each of the first gate lines is electrically connected to a first gate driver and the corresponding first pixel driving circuit, and each of the second gate lines is electrically connected to a second gate driver and the corresponding second pixel driving circuit; and a power control unit, comprising a power line, wherein the power line extends from the first region to at least one of the second gate lines arranged in the second region and close to the first gate lines, wherein the power line is electrically connected to or electrically insulated from the at least one of the second gate lines close to the first gate lines, wherein the power control unit further comprises a switching transistor and a control signal line, a gate of the switching transistor is electrically connected to the control signal line, one of a source and a drain of the switching transistor is electrically connected to the power line, and the other one of the source and the drain of the switching transistor is electrically connected to the corresponding second gate line.

12. The display panel according to claim 11, further comprising:

a first metal layer, comprising the first gate lines and the second gate lines;

an insulation layer disposed on the first metal layer; and a second metal layer disposed on the insulation layer, wherein the second metal layer comprises a plurality of data lines, electrically connected to the first pixel driving circuits and the second pixel driving circuits, and the power line.

13. The display panel according to claim 11, further comprising a border region adjacent to the first display region and the second display region, wherein the power line is arranged in the border region.

14. The display panel according to claim 11, wherein the display panel further comprises a border region adjacent to the first display region and the second display region, and the power line and the control signal line are arranged in the border region.

15. The display panel according to claim 14, wherein the gate of the switching transistor is connected to the corresponding control signal line through a via hole;

and/or, each of the second gate lines comprises a fan-out section arranged in the border region, and the other one of the source and the drain of the switching transistor is connected to the corresponding fan-out section through a via hole.

16. The display panel according to claim 11, wherein the control signal line is disposed in a same layer and made of a same material as the power line.

* * * * *